United States Patent
Xie et al.

(10) Patent No.: US 11,791,199 B2
(45) Date of Patent: Oct. 17, 2023

(54) NANOSHEET IC DEVICE WITH SINGLE DIFFUSION BREAK

(71) Applicant: International Business Machines Corporation, Armonk, NY (US)

(72) Inventors: Ruilong Xie, Niskayuna, NY (US); Kangguo Cheng, Schenectady, NY (US); Juntao Li, Cohoes, NY (US); Carl Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 17/406,351

(22) Filed: Aug. 19, 2021

(65) Prior Publication Data

US 2023/0054701 A1   Feb. 23, 2023

(51) Int. Cl.
| | |
|---|---|
| *H01L 21/762* | (2006.01) |
| *H01L 27/12* | (2006.01) |
| *H01L 29/66* | (2006.01) |
| *H01L 21/84* | (2006.01) |
| *H01L 27/088* | (2006.01) |

(52) U.S. Cl.
CPC ........ *H01L 21/76283* (2013.01); *H01L 21/84* (2013.01); *H01L 27/088* (2013.01); *H01L 27/1203* (2013.01); *H01L 29/66545* (2013.01)

(58) Field of Classification Search
CPC .............. H01L 21/76283; H01L 21/84; H01L 27/1203; H01L 29/0649; H01L 29/6656; H01L 21/0665; H01L 27/086; H01L 29/42392; H01L 29/0673
USPC ........................................ 438/284; 257/401
See application file for complete search history.

(56) References Cited

U.S. PATENT DOCUMENTS

| | | | |
|---|---|---|---|
| 8,609,510 B1 | 12/2013 | Banna | |
| 9,406,676 B2 | 8/2016 | Yu | |
| 9,412,616 B1 | 8/2016 | Xie | |
| 9,741,792 B2 | 8/2017 | Cheng | |
| 10,032,867 B1 | 7/2018 | Yeung | |
| 10,269,928 B2 | 4/2019 | Hong | |
| 10,388,519 B2 | 8/2019 | Smith | |
| 10,665,669 B1 * | 5/2020 | Xie et al. | ............ H01L 29/0649 |
| 10,734,224 B2 | 8/2020 | Smith | |
| 10,985,161 B2 | 4/2021 | Xu | |
| 2019/0172828 A1 | 6/2019 | Smith | |

FOREIGN PATENT DOCUMENTS

| | | |
|---|---|---|
| JP | 6291694 B2 | 3/2018 |
| KR | 1020200032224 A | 3/2020 |

* cited by examiner

*Primary Examiner* — Thinh T Nguyen
(74) *Attorney, Agent, or Firm* — Monchai Chuaychoo

(57) ABSTRACT

An approach for a nanosheet device with a single diffusion break is disclosed. The device comprises of active gate is formed above the BDI. At least the SDB is also formed over BDI with dielectric filled gate. The dielectric fill forms an indentation into the remaining nanosheets, under the spacer region, or between the inner spacers, in the SDB region. The method of creating the device comprises of, forming a gate cut opening between two ends of a dummy gate of one or more gates; forming a first sacrificial material on the gate cut opening; creating a single diffusion break; removing the dummy gate and oxide layer; removing, selectively a second sacrificial material; trimming, selectively stack of nanosheets; and forming dielectric in the gate cut opening and the single diffusion break.

9 Claims, 20 Drawing Sheets

NANOSHEET IC DEVICE WITH SINGLE DIFFUSION BREAK

BACKGROUND

The present invention relates generally manufacturing of integrated circuit devices, and more particularly to structures for nanosheet field-effect transistors and method of forming a single diffusion breaks onto the nanosheet field-effect transistors.

The myriad transistor devices that are formed as part of an IC (integrated circuit) product must be electrically isolated from one another to properly function in an electrical circuit. Normally, this is accomplished by forming a "trench" in the substrate and filling the "trench" with an insulating material (i.e., silicon dioxide). These isolation regions/trench can be referred to as "diffusion break".

An individual transistor of an IC may be isolated (electrically) from other transistors using a single diffusion break (SDB), which may occupy a single dummy gate. Or an individual transistor may rely on using a double diffusion break (DDB). The SDB may have smaller footprint (e.g., an SDB may be about 20 nm wide versus a double diffusion break (DDB).

A multigate device or also known as multi-gate MOSFET (metal-oxide-semiconductor field-effect transistor) refers to a transistor that incorporates more than one gate. The most widely used multi-gate devices are FinFET (Fin field effect transistor) and GAAFET (gate-all-around field effect transistor). FinFET are name based on the protrusions from the source/drain region which resembles "fins". GAAFET is similar in concept to a FinFET except that the gate material surrounds the channel region on all sides.

Some FETS may utilized nano technology such as nanowires or nanosheets to stack sheets of silicon. By stacking nanosheets, devices can be made wider than FinFET to boost current or narrower to limit power consumption. For example, nanosheet FETs flow current through multiple stacks of silicon that are completely surrounded by the transistor gate. The design allows for a reduction for a current to leak through. Furthermore, the design can boost the amount of current the device can drive.

SUMMARY

Aspects of the present invention disclose a device, computer-implemented method, and a computer system for a FET (field effect transistor) devices that utilizes nanosheets technology along with a SDB (single diffusion break). The device may include, a substrate comprising one or more gates, dummy oxide liner, one or more STIs (shallow trench isolation), one or more gate cuts and one or more gate spacers; a BDI (bottom dielectric isolation) is disposed above the substrate; one or more nanosheet devices with an active gate of the one or more gates is disposed above the BDI, wherein the one or more nanosheet devices comprises stacks of nanosheets; a SDB (single diffusion break) is disposed over the BDI with dielectric filled gate of the one or more gates and between the one or more gate spacers; and the dielectric filled gate forms an indentation into the remaining nanosheet stacks of the stacks of nanosheets, under the one or more gate spacers in the single diffusion break.

The computer implemented method for forming a FET devices that utilizes nanosheets technology along with a SDB may be implemented by one or more computer processors and may include, forming a gate cut opening in a dummy gate of one or more gates; forming a first sacrificial material on the gate cut opening; creating a single diffusion break; removing the dummy gate and oxide layer from the dummy gate; removing, selectively, a second sacrificial material; trimming, selectively, stack of nanosheets; and forming dielectric in the gate cut opening and the single diffusion break.

According to another embodiment of the present invention, there is provided a computer system. The computer system comprises a processing unit; and a memory coupled to the processing unit and storing instructions thereon. The instructions, when executed by the processing unit, perform acts of the computer implemented method according to the embodiment of the present invention.

BRIEF DESCRIPTION OF THE DRAWINGS

Preferred embodiments of the present invention will now be described, by way of example only, with reference to the following drawings, in which.

DETAILED DESCRIPTION

Figure 1:
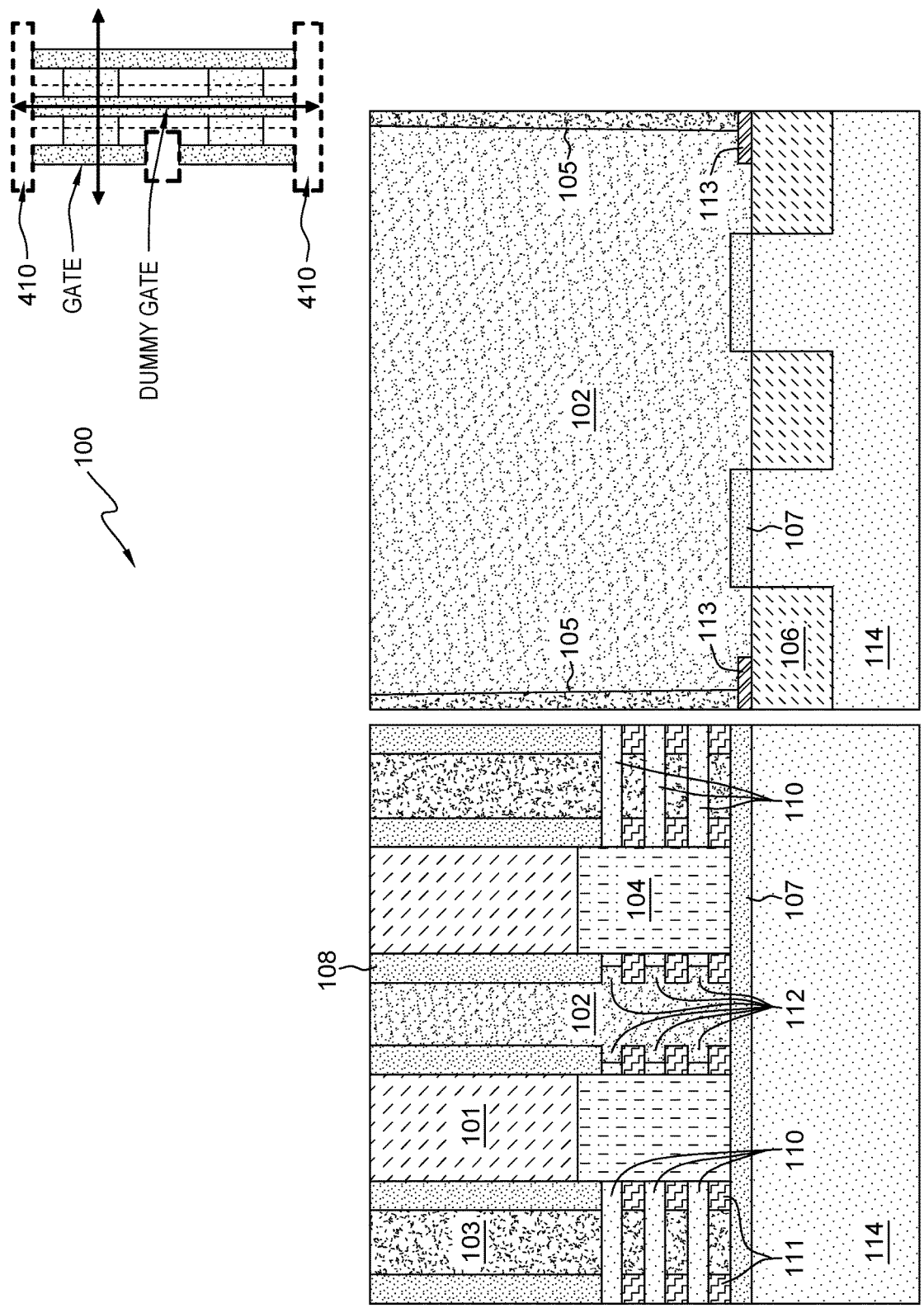
FIG. 1 illustrate a nanosheet device utilizing a SDB (single diffusion break), designated as nanosheet SDB 100, in accordance with an embodiment of the present invention.

Embodiments of the present invention provides an IC (integrated circuits), more specifically, FET (field effect transistor) devices that utilizes nanosheets technology along with a SDB (single diffusion break). Additionally, embodiments of the present invention are capable of being implemented in conjunction with any other type of FET device now known or later developed, including, for example, p-type GAA nanosheet FET architectures, wherein the GAA nanosheet FETs may contain silicon germanium channel nanosheets.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments, whether or not explicitly described.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should also be understood that material compounds will be described in terms of listed elements, for example, SiGe (Silicon Germanium). These compounds include different proportions of the elements within the compound, e.g., SiGe includes SixGe1−x where x is less than or equal to 1, etc. In addition, other elements may be included in the compound and still function in accordance with the present principles. The compounds with additional elements will be referred to herein as alloys.

Spatially relative terms, such as "beneath," "below," "lower," "above," "upper," and the like, may be used herein for ease of description to describe one element's or feature's relationship to another element(s) or feature(s) as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

In general, the various processes used to form a microchip and/or ICs belongs into four general categories, such as, film deposition, removal/etching, semiconductor doping and patterning/lithography. Deposition is any process that grows, coats, or otherwise transfers a material onto the wafer. For example, deposition technologies include physical vapor deposition (PVD), chemical vapor deposition (CVD), plasma-enhanced chemical vapor deposition (PECVD), electrochemical deposition (ECD), molecular beam epitaxy (MBE), atomic layer deposition (ALD) and plasma-enhanced atomic layer deposition (PEALD).

Removal/trimming/etching is any process that removes material from the wafer. Examples include etch processes (either wet or dry), and chemical-mechanical planarization (CMP), and the equivalent.

Similarly, the process of patterning/lithography may include conventional techniques such as using radiation sources to form patterns. Other techniques may include, direct-write e-beam and nanoimprint. Furthermore, there are also several next-generation lithography (NGL) technologies in R&D, such as extreme ultraviolet (EUV), multi-beam e-beam and directed self-assembly (DSA).

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

It should be understood that the Figures are merely schematic and are not drawn to scale. It should also be understood that the same reference numerals are used throughout the Figures to indicate the same or similar parts.

Structural Features

By way of example, a FET device will be described with using nanosheet stacks. Any IC (e.g., FinFET, GAAFET, etc.) device can be used and may derive benefits from using nanosheet with a diffusion breaks (i.e., single diffusion break). Embodiments of the present invention forms the single diffusion break over the BDI (bottom dielectric isolation), with an indentation (see 112 of FIG. 1) into remaining Si layers that is disposed between the nanosheet stacks inner gate spacer.

FIG. 1 is a depiction of a nanosheet FET device, designated as nanosheet SDB 100, with a single diffusion break area, in accordance with an embodiment of the present invention. The views depicted shows X-axis and Y-axis view along with Y-axis perspective. Embodiments of the present invention has the following, but it is not limited to, components (see FIG. 1): ILD 101, SDB 102, HKMG 103, S/D epi 104, gate cut 105, STI (shallow trench isolation) 106, BDI 107, gate spacer 108, nanosheet stacks 110, inner spacers 111, indentation 112, dummy liner 113 and Si substrate 114.

Components of nanosheet SDB 100 are arranged (from bottom to top, X-axis view of FIG. 1) as follows, Si substrate 114, STI 106, BDI 107, dummy liner 113, inner spacers 111, nanosheet stack 110, S/D epi 104, SDB 102, HKMG 103, ILD 101 and gate spacer 108. STI 106, dummy liner 113 and BDI 107 are above Si substrate 114. The remaining components, previously mentioned, are situated above BDI 107, STI 106 and dummy liner 113.

ILD 101 is the inter-layer dielectric (ILD) is a dielectric material used to electrically separate closely spaced interconnect lines that has been arranged in several levels in an advanced IC.

SDB 102 is a single diffusion break (SDB). Typically, there are myriad of transistor devices that are formed as part of an IC product must be electrically isolated from one another to properly function in an electrical circuit. Normally, this is accomplished by forming a "trench" in the substrate and filling the "trench" with an insulating material (i.e., silicon dioxide). These isolation regions/trench can be referred to as "diffusion break". An individual transistor of an IC may be isolated (electrically) from other transistors using a single diffusion break (SDB), which may occupy a single dummy gate.

HKMG 103 is a high-k/metal gate. S/D epi 104 are source/drain epi (epitaxies). Gate cut 105 are an area/region of a gate that has been "trimmed" and/or "cut" to remove unwanted portions of the gate (see 105 of FIG. 1) followed by dielectric fill. STI 106 is a shallow trench isolation which prevents electric current leakage between adjacent transistors.

BDI 107 is a bottom dielectric isolation (BDI). Typically a BDI structure involves the introduction of a dielectric layer underneath both the source/drain and gate regions. The benefits of implementing a full BDI scheme is to reduce sub-channel leakage, immunity to process variation and power-performance improvement. Specifically BDI 107 extends from beneath the first gate, to beneath the single diffusion break, to beneath the second gate. There is a portion of the single diffusion break that is in contact with vertical surfaces of the BDI underneath the single diffusion break.

Gate spacer 108 are materials used to isolate and/or provide a buffer for the gates. Gate spacers can be made from dielectric materials such as SiN, SiBCN, SiOCN and SiOC.

Nanosheet stacks 110 are layers of silicon (in stacks) that replaces the traditional shape of "fins" but provides the same functionality as a fins (i.e., channel between the source and drain) in FinFET devices. A nanosheet (and including stacks of nanosheet) may refer to any material having a thickness of 100 nm or less. A nanosheet may comprise a two-dimensional material, such as graphene, MoS2, or equivalent. Alternatively, a nanosheet may comprise a thin (100 nm or less) stack of a materials, such as MoS2, silicon, or equivalent. Although described using silicon, any appropriate semiconductor material or metal may be used in nanosheet stacks. As shown in FIG. 1, nanosheet stacks 110 is located under spacer region (i.e., gate spacer 108 and inner spacer 111) as well as under the gates (i.e., HKMG 103).

Inner spacer 111 are materials provide isolation and/or buffer between the lower portion of the gates that are disposed within the nanosheet stacks and the S/D epi 104. Inner spacers 111 can be made from dielectric materials such as SiN, SiBCN, SiOCN and SiOC. In some embodiments, gate spacer 108 can be made from SiBCN and inner spacer 111 can be made from SiOCN.

In some embodiments, gate spacer 108 can be made from SiN and inner spacer 111 can be made from SiOCN. In other embodiments, both gate spacer 108 and inner spacer 111 can be made from the same material.

Indentation 112 is an area/region where the SDB encroaches (makes an indentation) into the remaining nanosheets and inner spacers 111.

Dummy liner 113 is a liner material used during the deposition of the dummy gate stack. Dummy liner 113 can be made out of any oxide material. For example, dummy liner 113 may comprise, silicon dioxide, HfO2, LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba, Sr)TiO3 (BST), Al2O3, Si3N4, silicon oxynitrides (SiON), or equivalent.

Si substrate 114 is the starting structure where all other components (e.g., gates, SDB, nanosheet stacks, etc.) is formed. Si substrate 114 is made from silicon material, which may comprise of p-type substrate with one or more n-type features. In other embodiments, Si substrate 114 may comprise of n-type substrate with p-type features.

In some embodiments, a nanosheet device is disclosed and comprise of, stack of nanosheet with an active gate is formed above the BDI. At least a SDB is also formed over BDI with dielectric filled gate. The dielectric fill forms and indentation into the remaining Si sheets, under the spacer region, or between the inner spacers, in the SDB region.

Manufacturing Features

Figure 2:
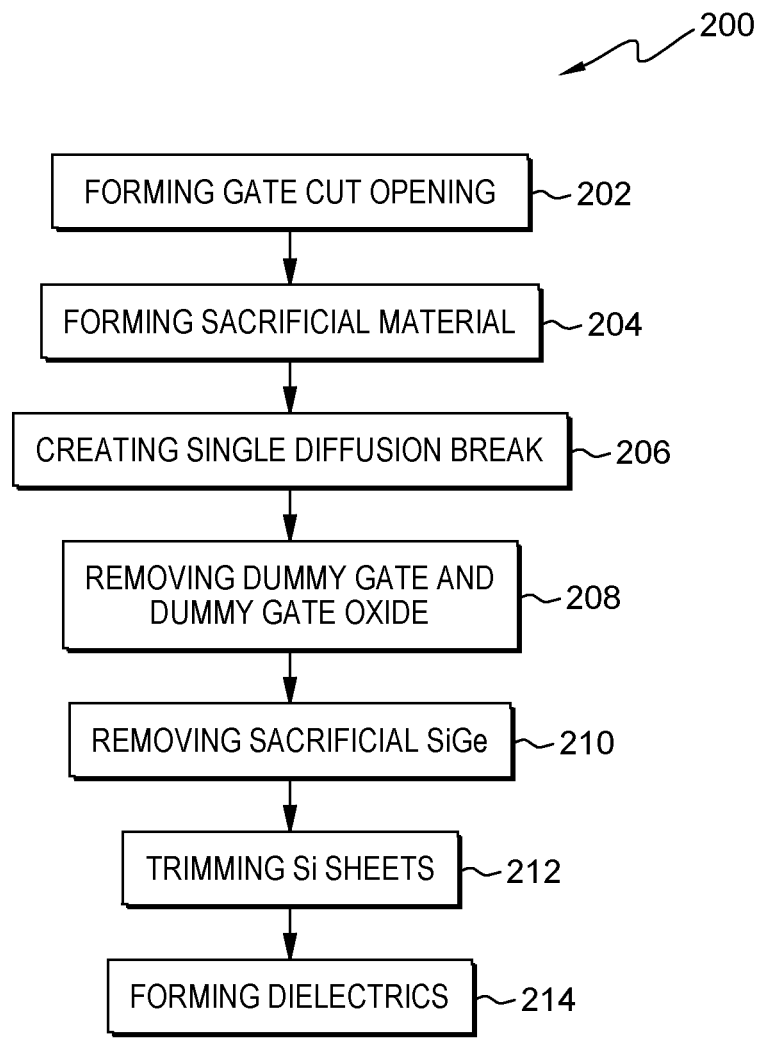
FIG. 2 illustrate a high level flowchart, designated as process 200, of the method for creating nanosheet SDB 100, in accordance with an embodiment of the present invention.

FIG. 2 illustrate a high level flowchart, designated as process 200, of the method in creating nanosheet SDB 100, in accordance with an embodiment of the present invention. Process 200, may include the following steps: (i) forming gate cut openings at two ends of a dummy gate of a single diffusion break (step 202), (ii) forming sacrificial material into the said gate cut openings (step 204), (iii) opening the single diffusion break (step 206), (iv) selectively removing the dummy gate and dummy gate oxide (step 208), (v) selectively removing the sacrificial SiGe (step 210), (vii) selectively trimming the Si sheets (step 212) and (viii) forming dielectrics in the gate cut and single diffusion break (step 214).

Process 200 begins by forming gate cut openings at two ends of a dummy gate of a SDB (step 202). This step assumes that there is already a substrate material populated with the following structures, but it is not limited to, nanosheet stacks, fully formed gates with spacers, s/d epis, single diffusion break (SDB) and BDI layer. It would be useful to refer to FIGS. 4A through 4D on this existing structure.

Figure 4A:
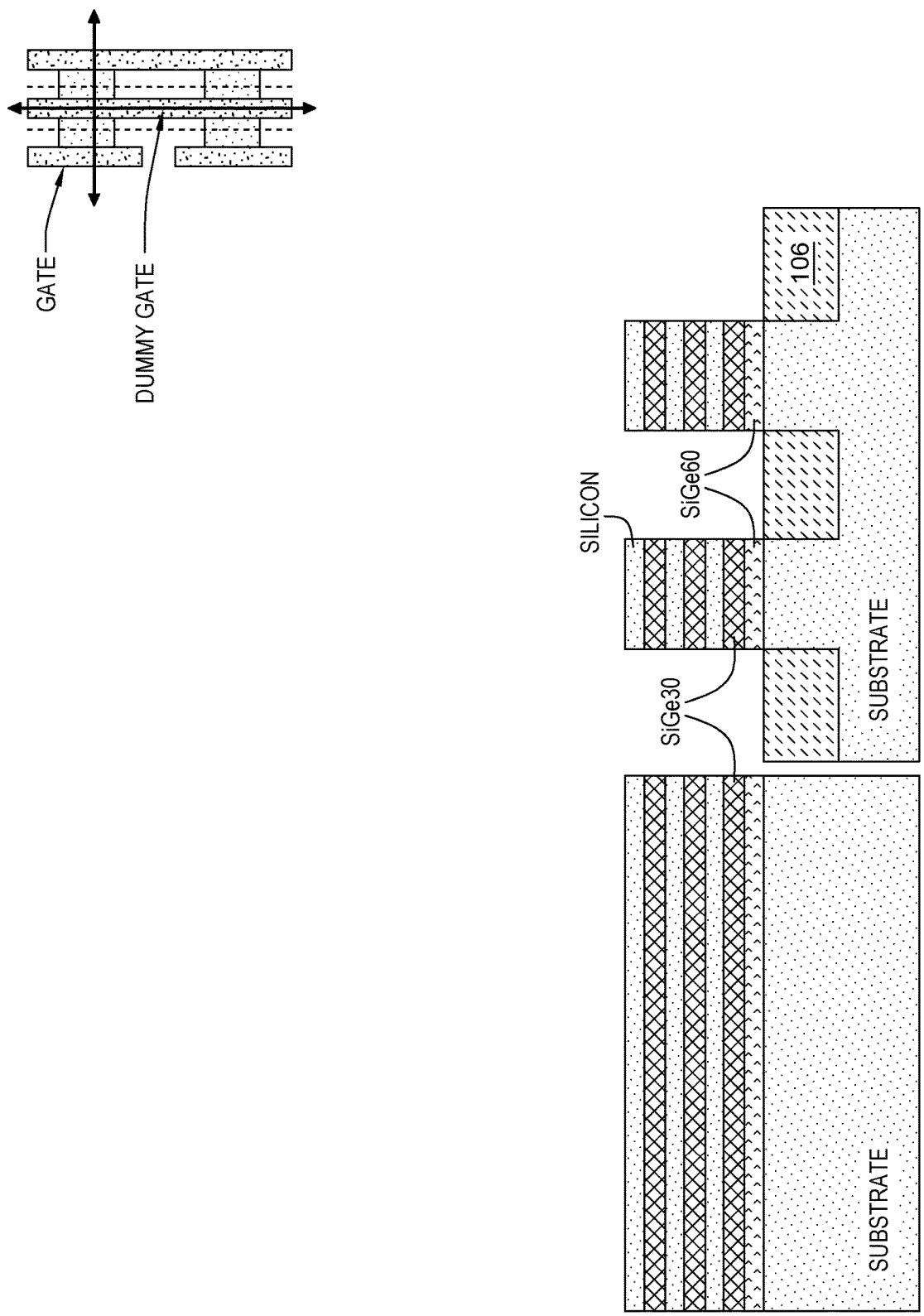
FIGS. 4A through 4P illustrates the manufacturing steps for creating nanosheet SDB 100, in accordance with an embodiment of the present invention.
Figure 4B:
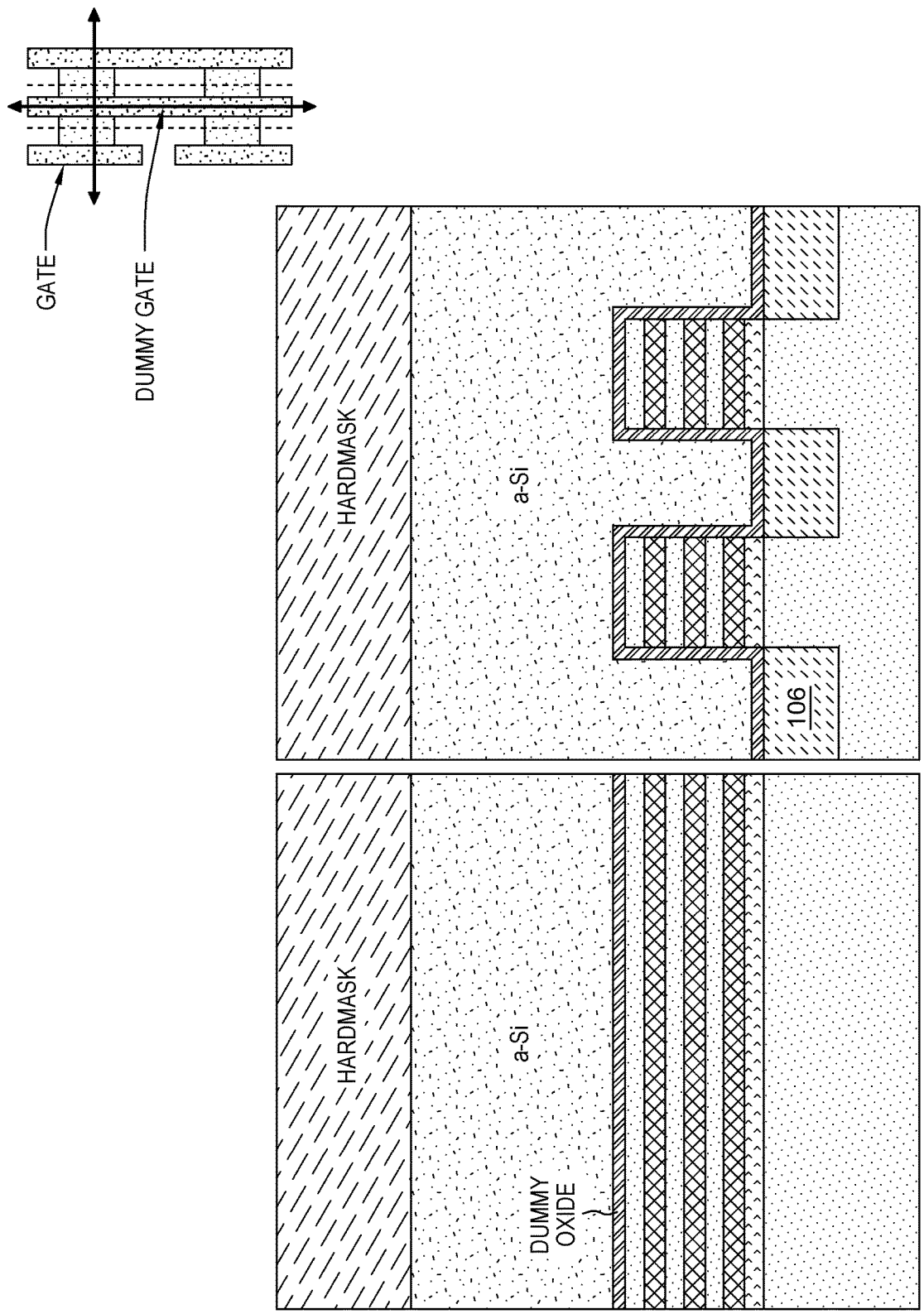
Figure 4C:
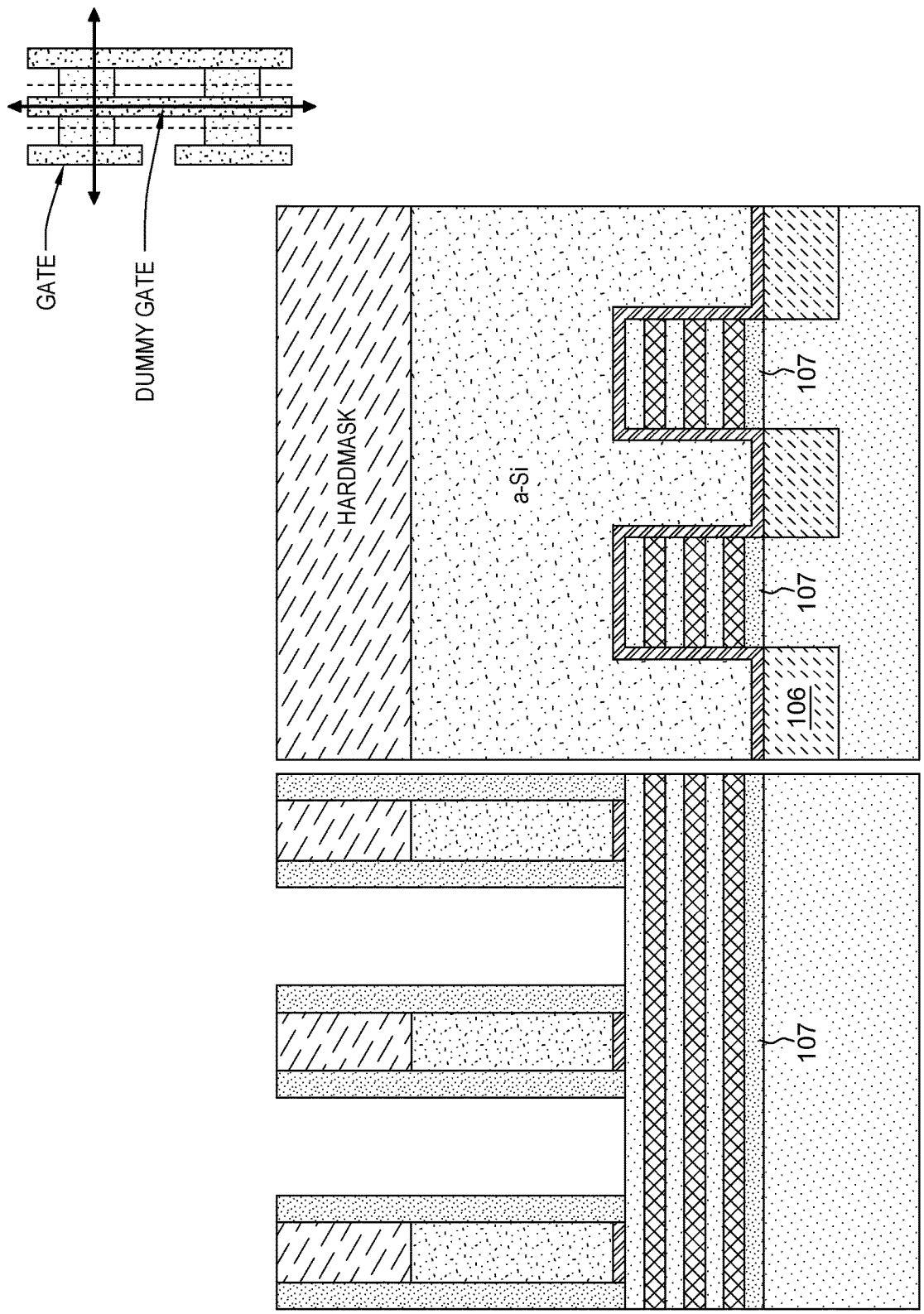
Figure 4D:
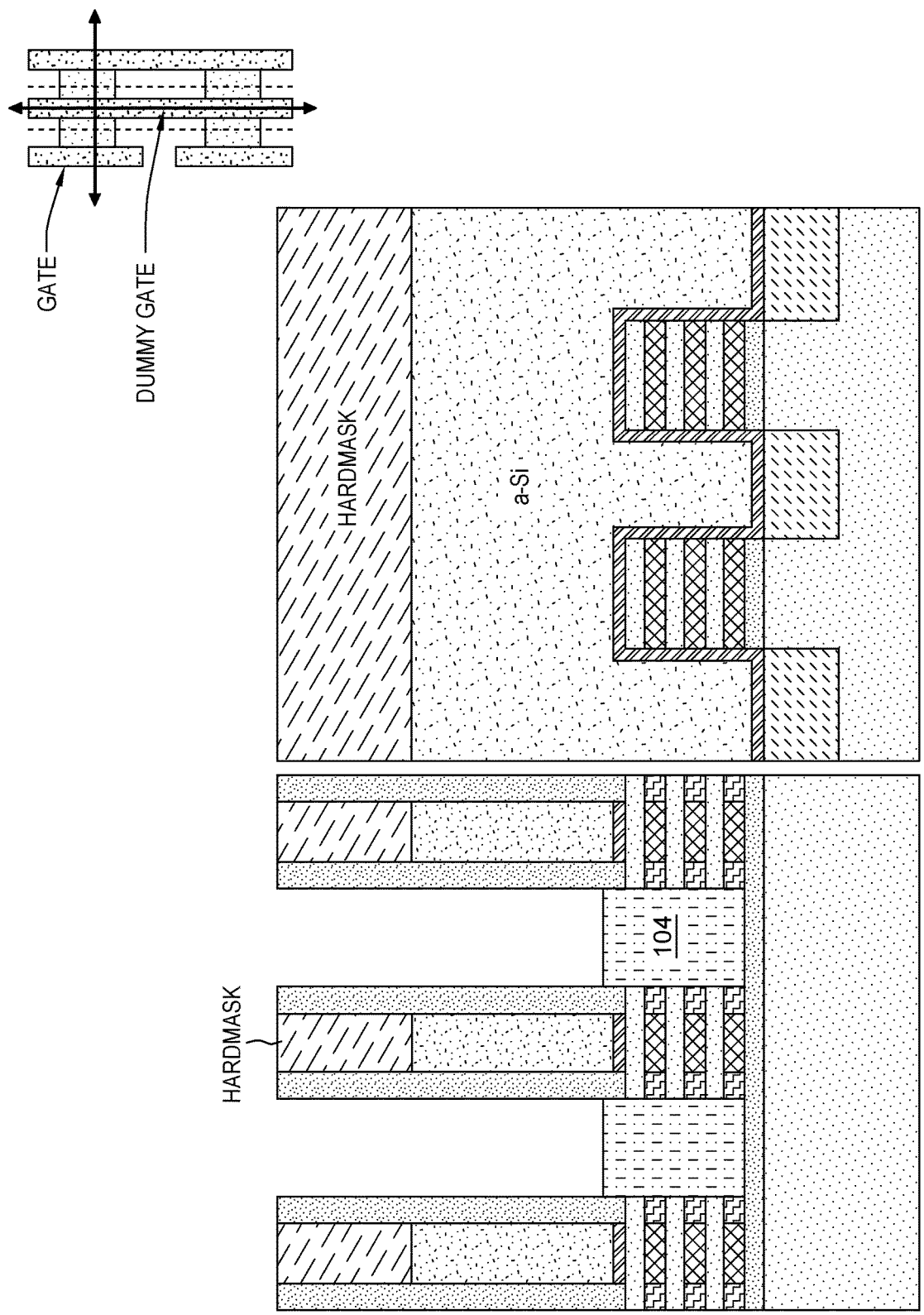
Figure 4E:
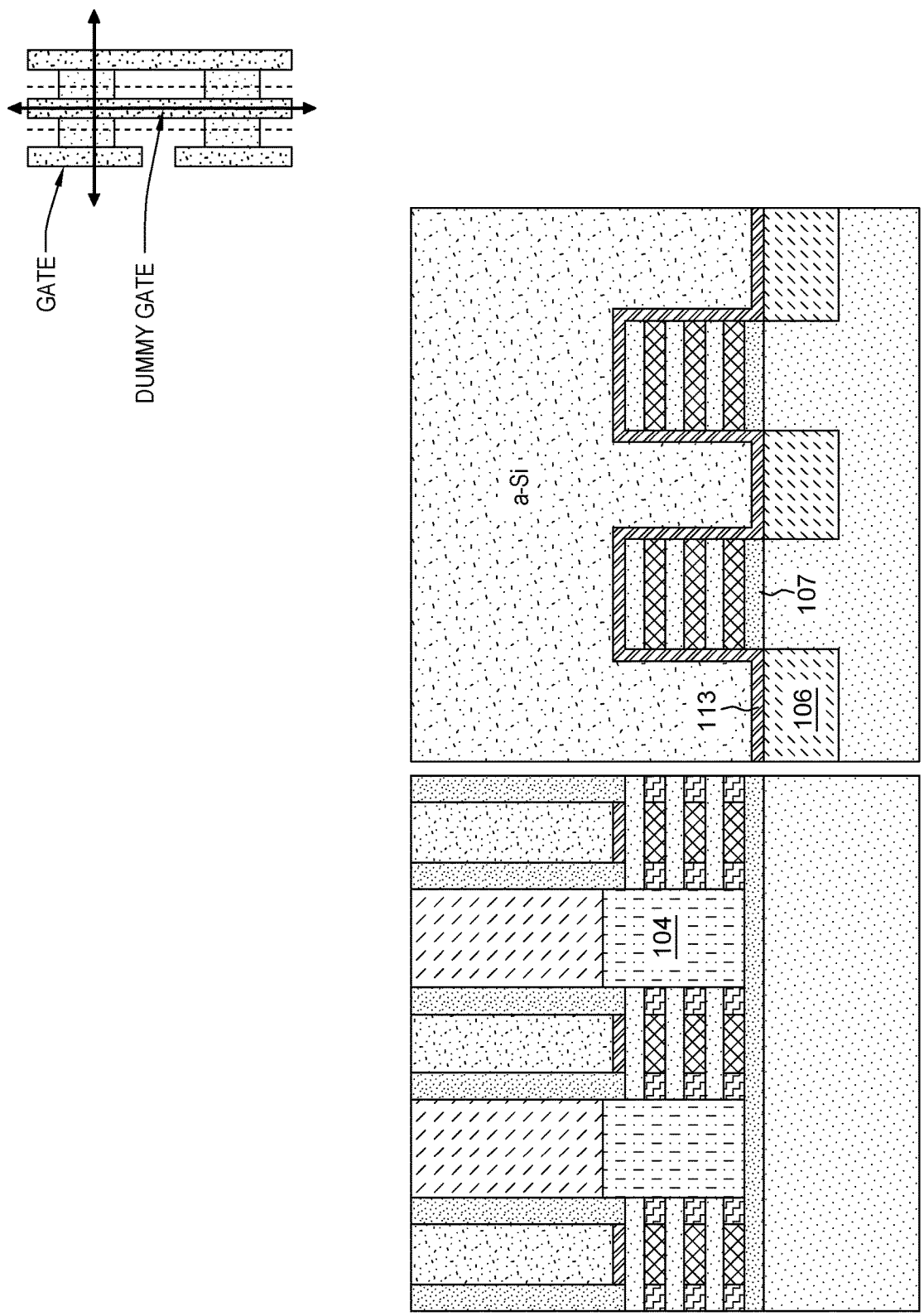
Figure 4F:
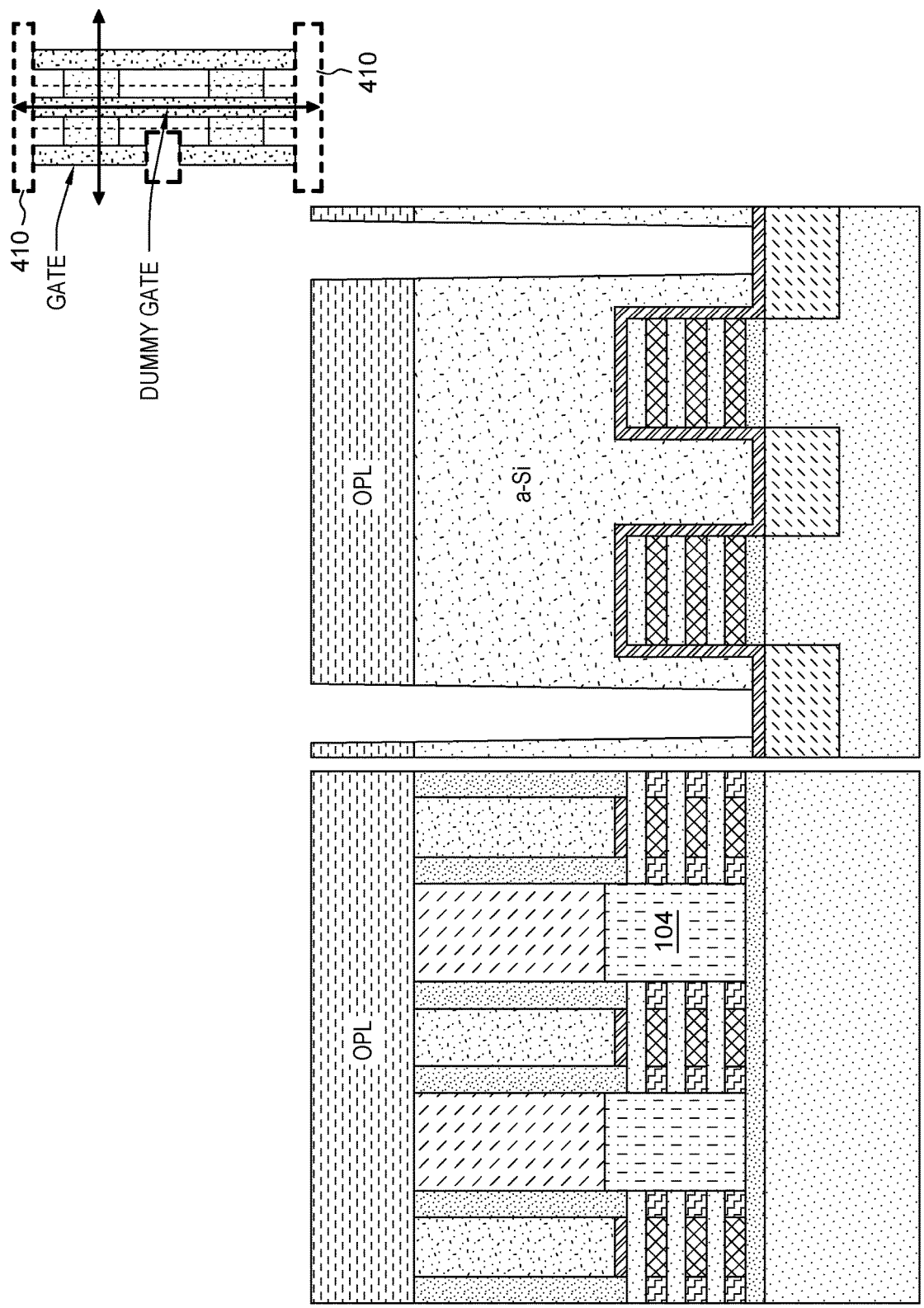

Step 202 can be referenced to FIG. 4F. An area to be cut must be defined by the user (i.e., patterning) and the two ends (410 of FIG. 4F) of the dummy gate are the location to be cut. However, a deposition of OPL (organic planarization layer) is first formed over the existing nanosheet stack (already on a substrate) before gate cut patterning and etch can begin. Any known method of patterning can be employed and any known method of cutting (i.e., removing materials from a semiconductor layers) can be utilized, such as, etching (e.g., dry etching, wet etching, plasma etching, etc.). After the gate has been cut, OPL is removed, and another layer of OPL is deposited.

Figure 4G:
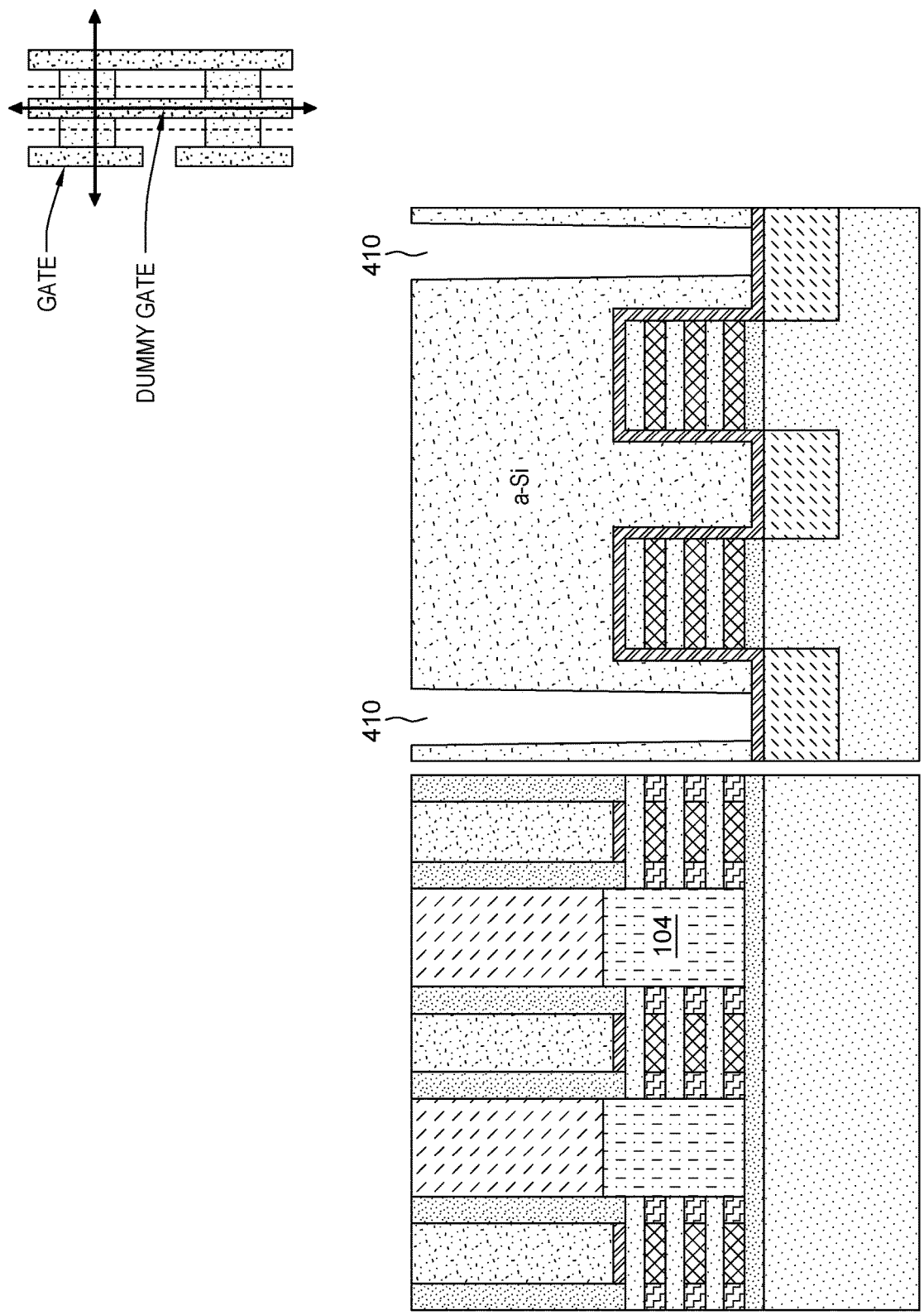
Figure 4H:
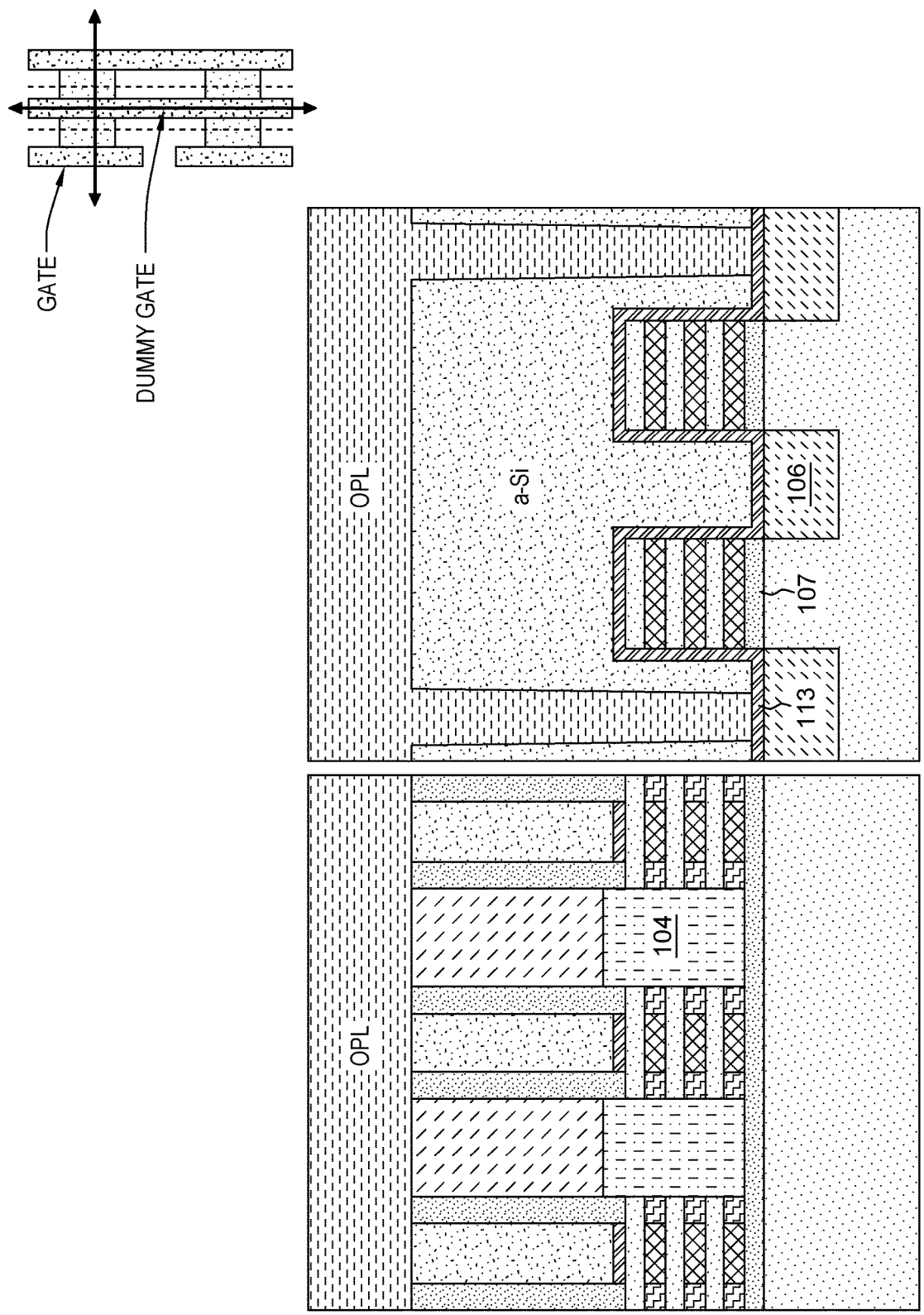

Process 200 continues with forming sacrificial material into the gate cut openings (step 204). Step 204 involves depositing a layer of OPL as the sacrificial material. Step 204 can be referenced to FIG. 4H.

Figure 4I:
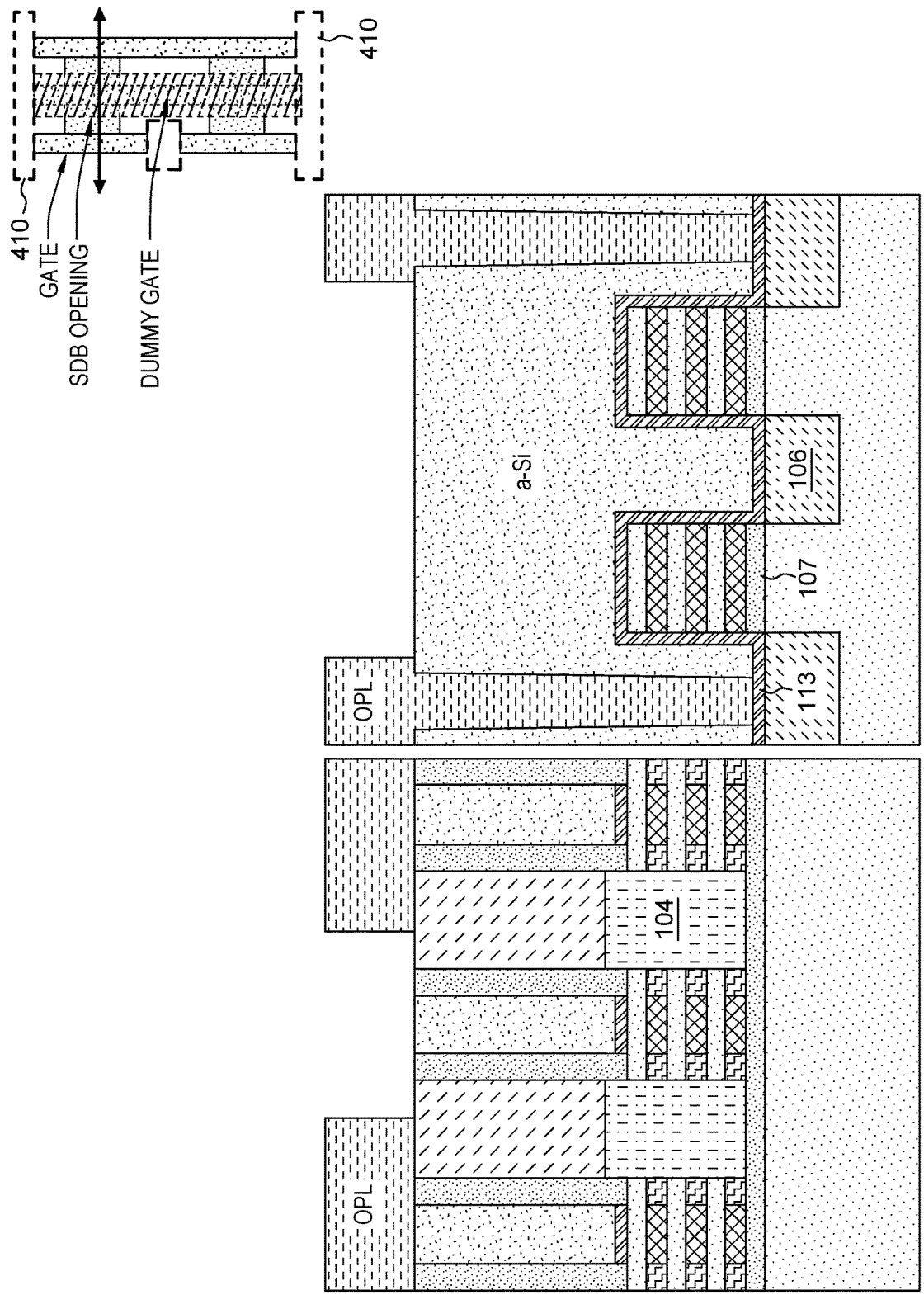

Process 200 continues with creating the single diffusion break in the OPL (step 206). Step 206 begins with SDB litho patterning and SiARC/OPL etch. Any known method of patterning can be employed and step 206 can be referenced to FIG. 4I.

Figure 4J:
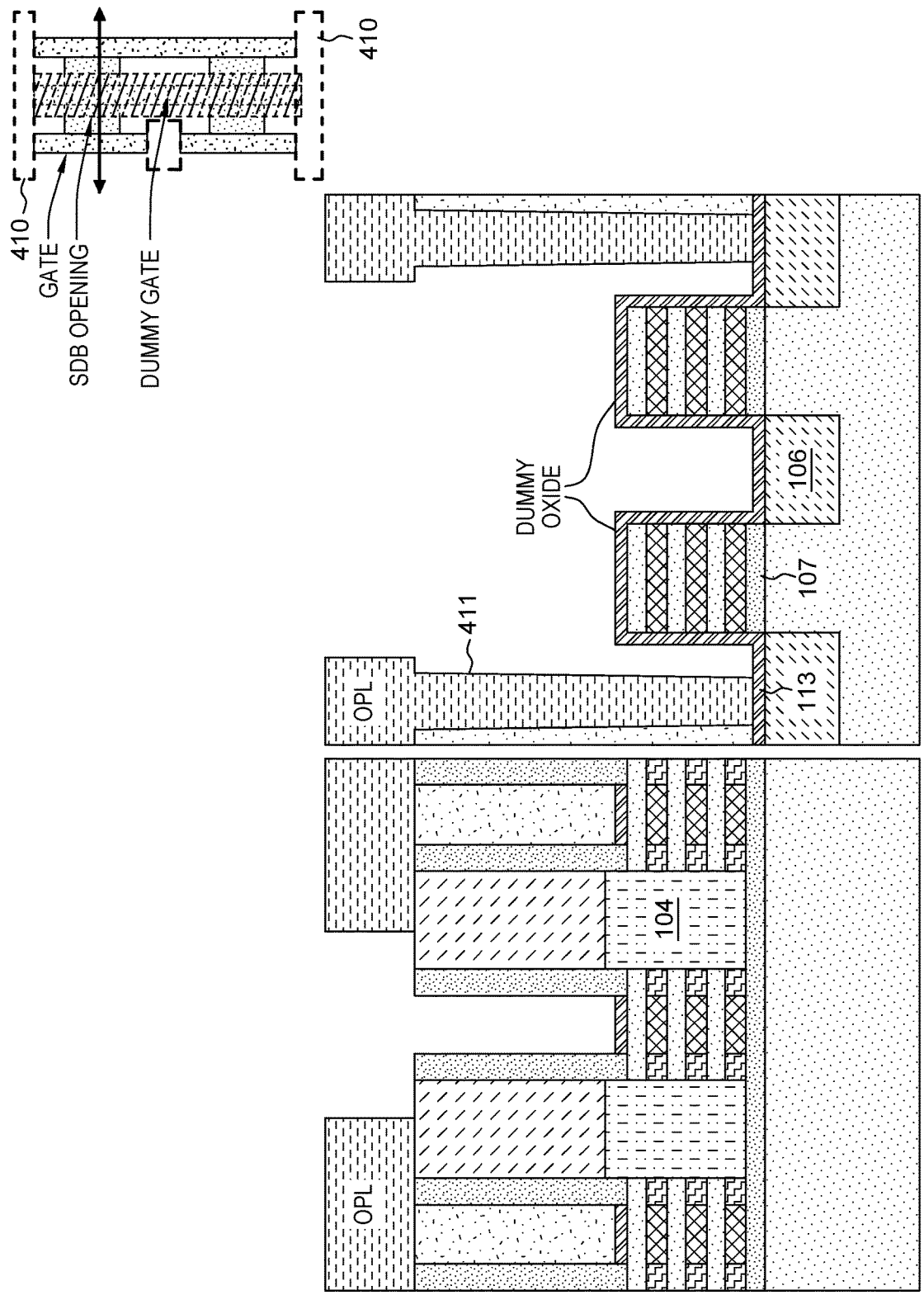
Figure 4K:
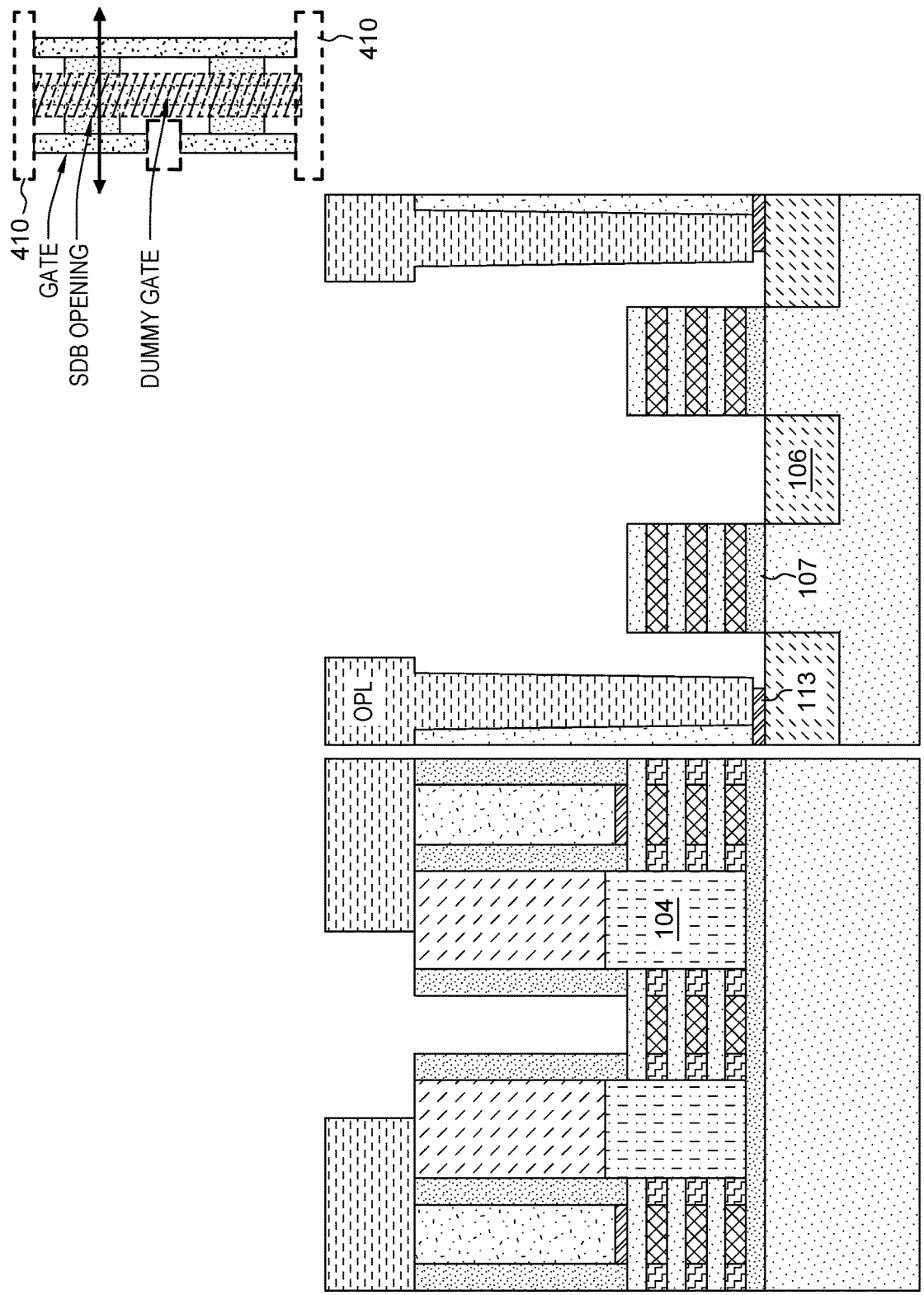

Process 200 continues with selectively removing the dummy gate and dummy gate oxide (step 208). As used herein, the term "selective" or "selectively" in reference to a material removal process (e.g., etching) denotes that, with an appropriate etchant choice, the material removal rate (i.e., etch rate) for the targeted material is greater than the removal rate for at least another material exposed to the material removal process. Step 206 can be referenced to FIG. 4J. Any known method of etching can be employed but there must be careful consideration when removing materials. The OPL "pillars" (located at the end of the dummy gate, see 411 of FIG. 4J) should be preserved during the etching of the dummy gate oxide material, such as, a-Si (amorphous-Silicon) because the pillars help prevents a-Si lateral under cut. Step 206 continues with etching of the dummy oxide liner. This part of step 206 can be referenced to FIGS. 4K through 4J.

Figure 4L:
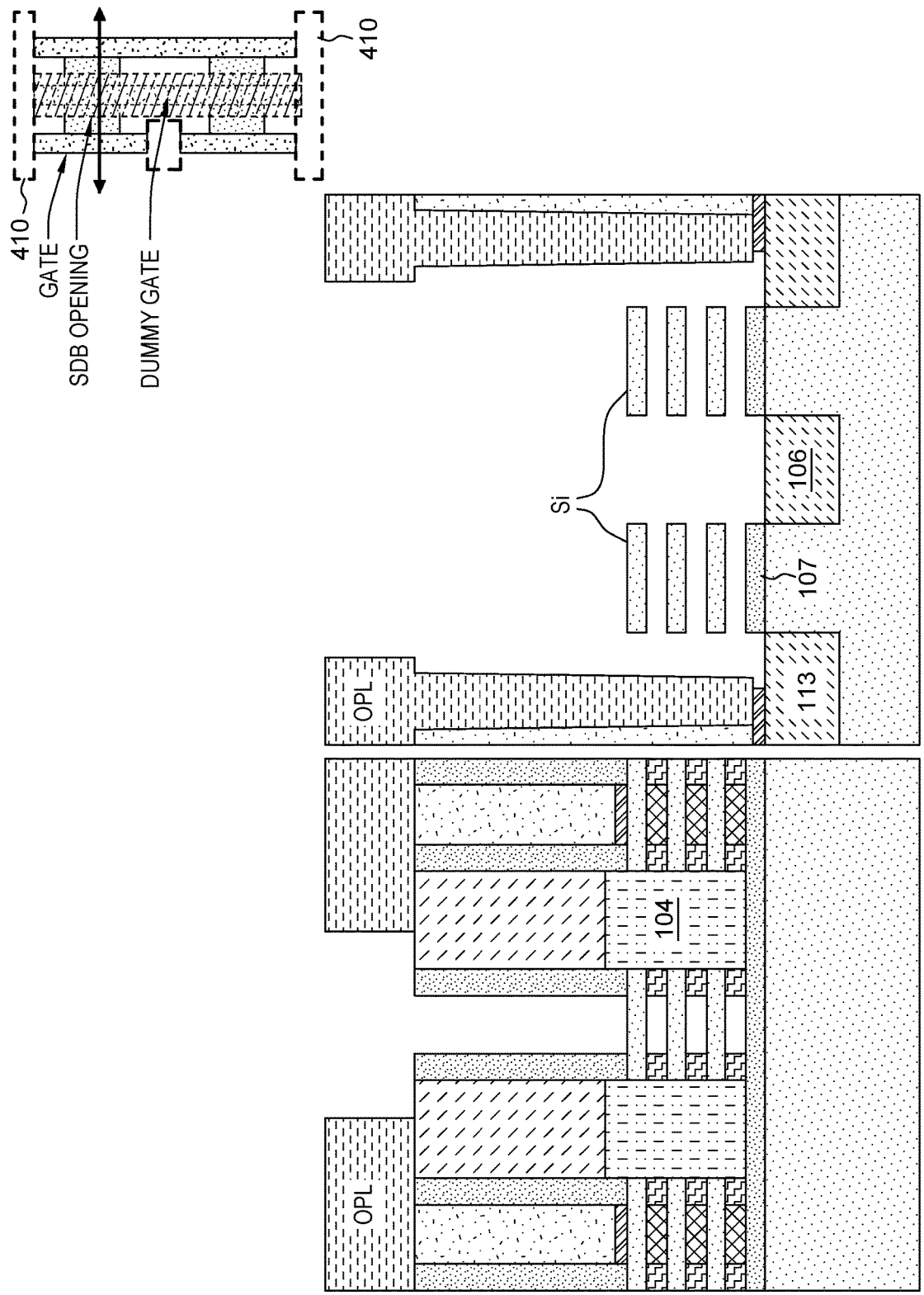

Process 200 continues with SiGe removal with respect to surrounding materials (step 210). Step 210 involves removing the SiGe material disposed between the nanosheet stacks. SiGe removal by any known method such as, using isotropic etching process (i.e., vapor phased HCl dry etch). Step 210 can be referenced to FIG. 4L.

Figure 4M:
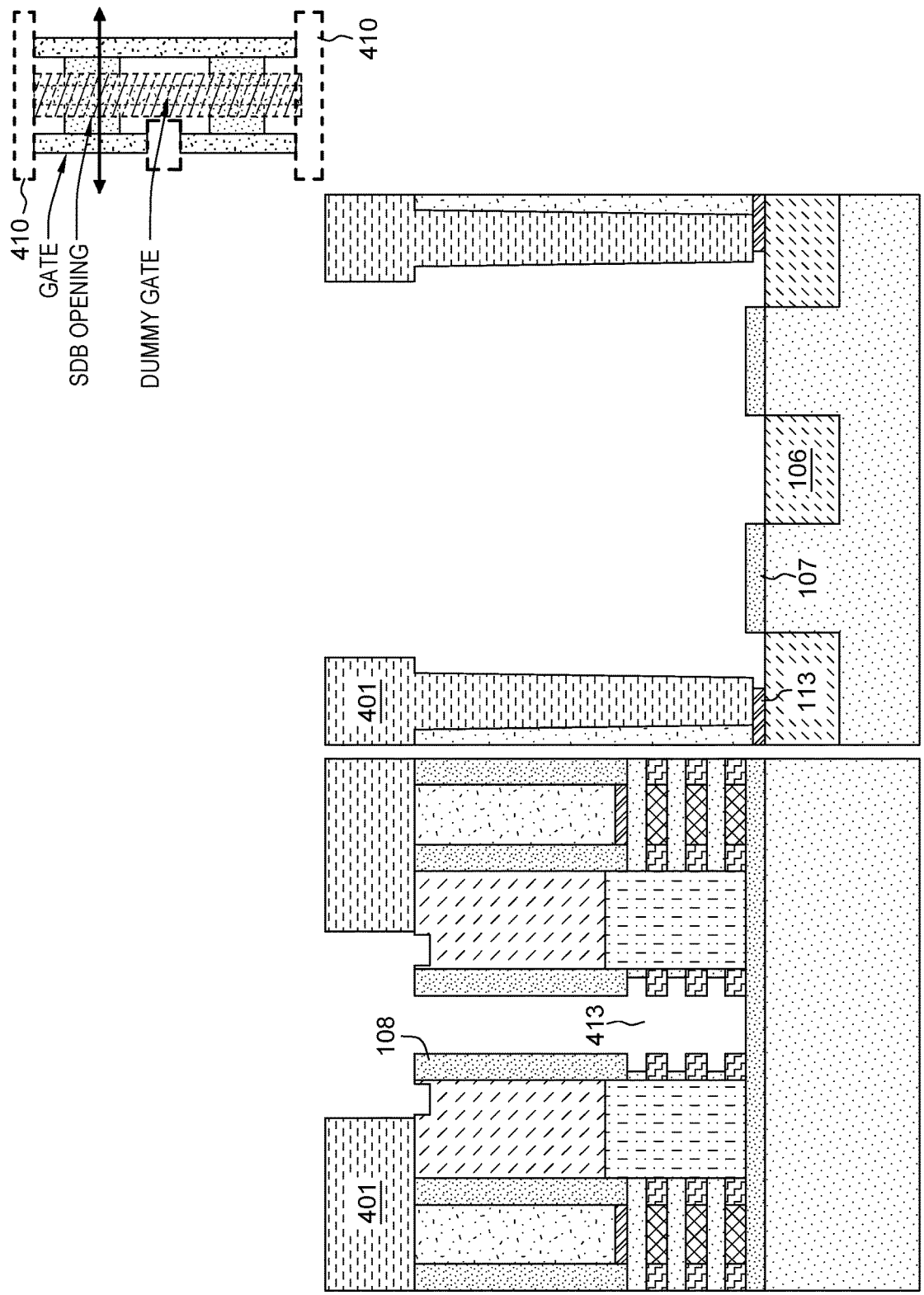

Process 200 continues with selectively trimming the Si sheets (step 212). Step 212 involves selectively trimming Si from the SDB area. Step 212 can be referenced to FIG. 4M. Step 210 involves selectively trimming Si layers (between the nanosheet stacks) but careful attention must be placed without removing too much of the Si layers over there can be damaged to the epi structure (see 413 of FIG. 4M).

Process 200 ends with forming dielectrics in the gate cut and single diffusion break (step 214). Step 214 involves performing a dielectric fill and CMP (chemical mechanical polish). Furthermore, step 214 involves an RMG (replace metal gate) process performed on the materials (e.g., hard mask and a-Si) that were used as part of the gate formation during step 202 through step 210. The final gates are now composed of HK/MG.

It can be stated that other steps/process relating Middle-of-line (MOL) and back-end-of-line (BEOL) can follow after step 214, which includes formation of contacts and wiring for the local interconnect structure overlying the device structure, and formation of dielectric layers, via plugs, and wiring for an interconnect structure, etc.

Figure 3:
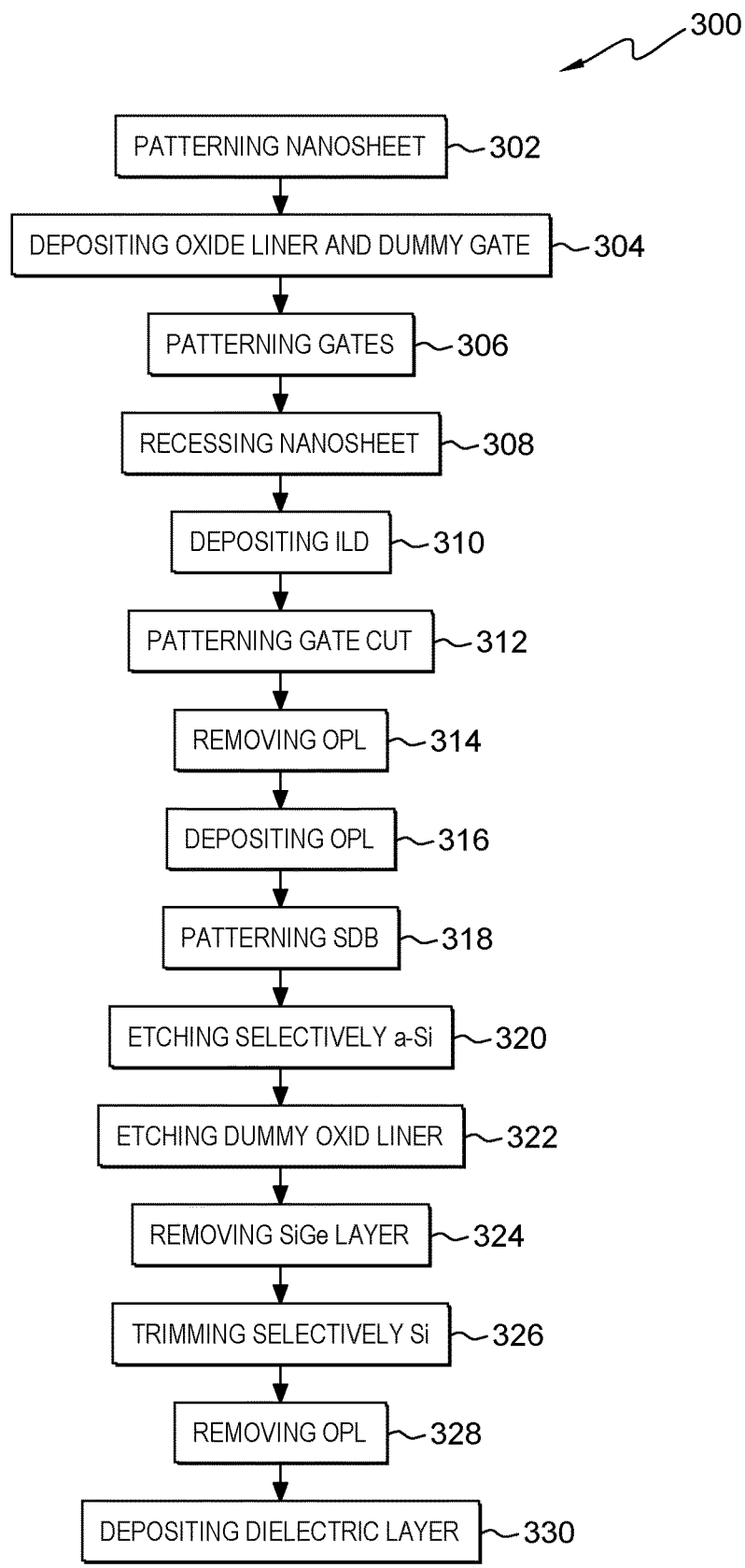
FIG. 3 illustrate a high level flowchart, designated as process 300, of an alternative method for creating nanosheet SDB 100, in accordance with another embodiment of the present invention.
Figure 4N:
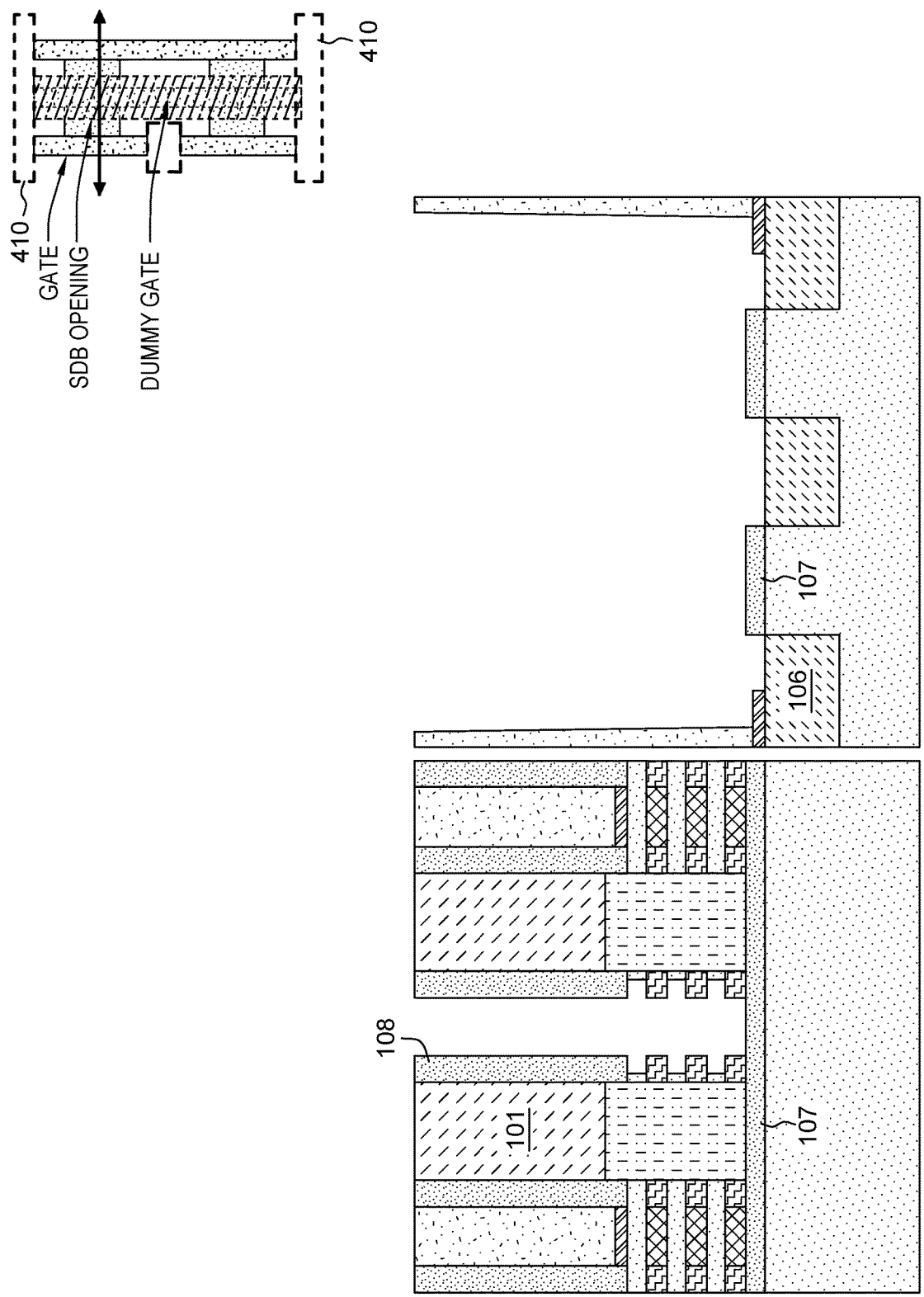
Figure 4O:
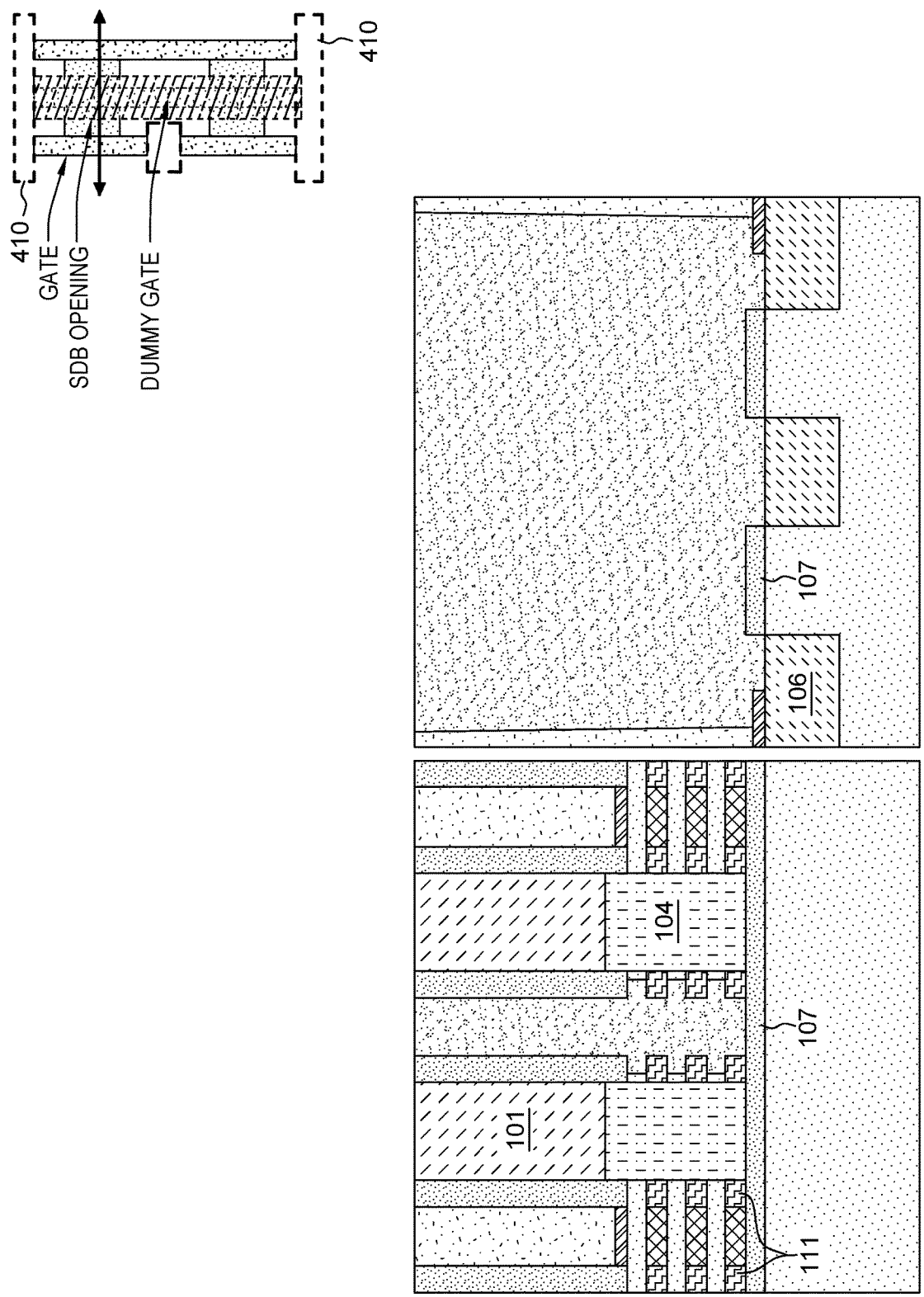
Figure 4P:
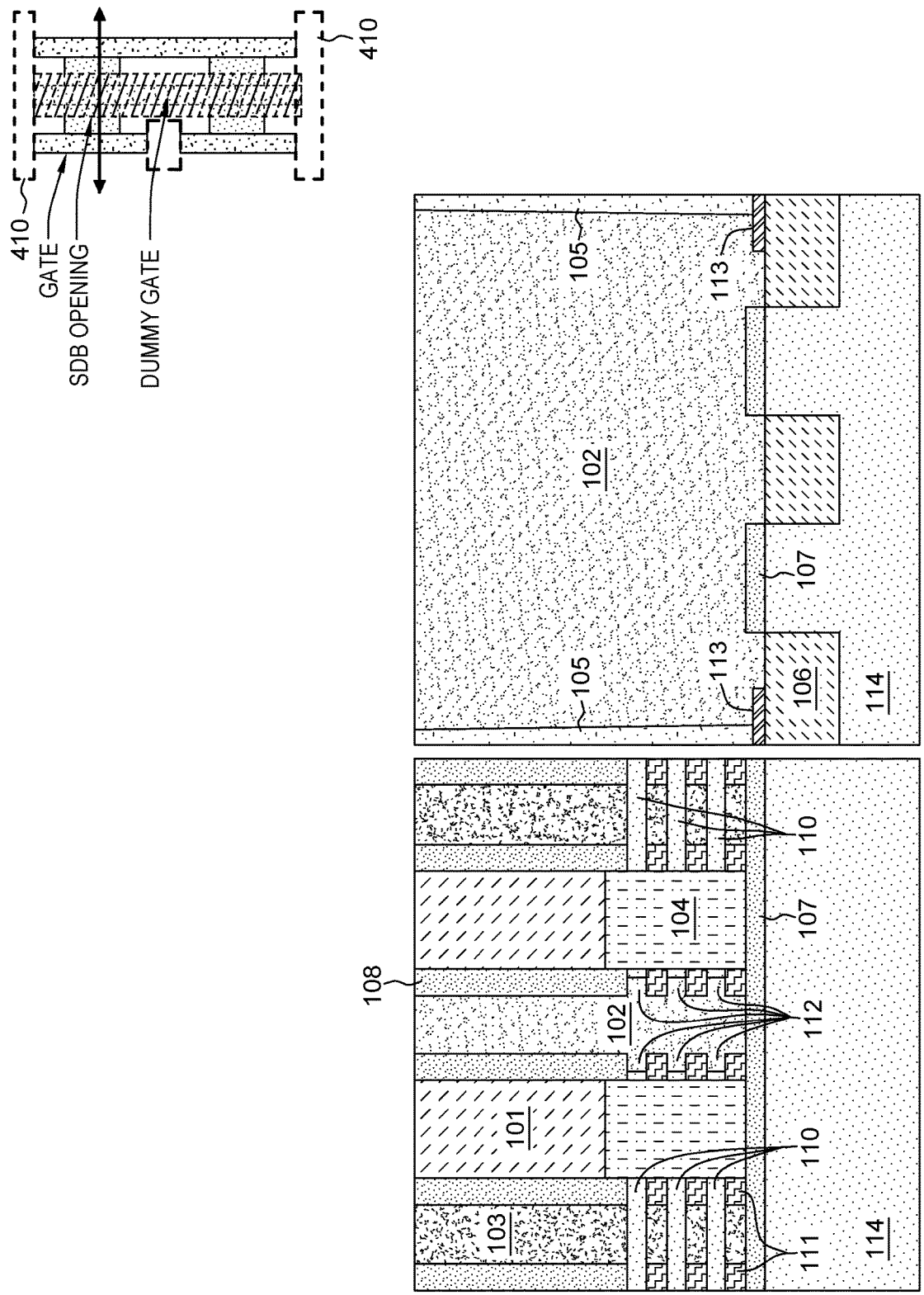

FIG. 3 illustrate an alternative flowchart, designated as process 300, of the method in creating nanosheet SDB 100, in accordance with another embodiment of the present invention. FIGS. 4A-4P illustrates process 300 and is an alternative embodiment of process 200. Thus, it would be helpful to refer to FIGS. 4A-4P.

Process 300 begins with step 302. Step 302 (refer to FIG. 4A), begins with nanosheet patterning and STI formation. The initial nanosheet stack includes alternative SiGe and Si layers. The very bottom epitaxy SiGe layer has high Ge % (e.g., 50% or higher Ge %, here we use SiGe60 to represent this layer), and other SiGe layers above and in between Si sheets are with lower Ge % (e.g., <35% Ge %). After that, Nanosheet stack is being patterned by litho and etch process. After that, STI is formed. Any method for nanosheet patterning (e.g., sidewall imaging transfer, self-aligned double patterning, etc.) and STI formation may be used (e.g., dielectric deposition, CMP followed by dielectric recess).

Process 300 continues with step 304. Step 304 (refer to FIG. 4B) involves depositing a dummy oxide liner and forming a dummy gate stack (by deposition). Any known deposition techniques may be used.

Process 300 continues with step 306. Step 306 (refer to FIG. 4C) involves gate patterning and SiGe60 removal. Step 306 also includes formation of gate spacers and BDI. SiGe60 can be selectively removed by vapor phased HCl at appropriate temperature and pressure. BDI and gate spacer can be formed by conformal dielectric liner deposition followed by anisotropic etch process.

Process 300 continues with step 308. Step 308 (refer to FIG. 4D) involves recessing the nanosheet stack, SiGe indentation, inner spacer formation and S/D epi formation. Recessing the nanosheet stacks means removing excess materials to form cavities between the dummy gates for S/D epi formation. In regards to "SiGe indentation" means that the process involves selectively etching SiGe to/from the surround materials. Recall that selectively etching means an etching process that uses, for example, a vapor phase HCL dry etch to form a cavity. Specific to selectively SiGe, a cavity is created where the inner spacer will be formed. Any known techniques can be used for forming inner spacers and S/D epis (e.g., deposition, etc.).

Process 300 continues with step 310. Step 310 (refer to FIG. 4E) involves depositing an ILD (inter layer dielectric) and followed by a CMP (Chemical mechanical polish).

Process 300 continues with step 312. Step 312 (refer to FIG. 4F) involves gate cut patterning. Any known patterning techniques can be used to pattern the gates, such as OPL coat as softmask, followed by litho patterning and etching process.

Process 300 continues with step 314. Step 314 (refer to FIG. 4G) involves OPL ash. Any known etching/removing techniques may be used to remove the OPL (from previous step), such as N2/H2 ash.

Process 300 continues with step 316. Step 316 (refer to FIG. 4H) involves depositing another OPL. Any known deposition techniques may be used, such as spin-on coating.

Process 300 continues with step 318. Step 318 (refer to FIG. 4I) involves SDB patterning. Any known patterning techniques can be used to pattern the SDB in softmask, such as OPL. For example, a lithography mask can be used and followed an etch process.

Process 300 continues with step 320. Step 320 (refer to FIG. 4J) involves selective a-Si etching. Selectively etch a-Si means that the process involves selectively etching (i.e., removing) a-Si from the surround materials (i.e., a selective dry Si etch or wet etch.).

Process 300 continues with step 322. Step 322 (refer to FIG. 4K) involves etching a dummy oxide liner. Recall that a dummy oxide liner was deposited in step 304. Now, it is being removed by etching. Any known etching/removing techniques may be used, such as SiCoNi or COR oxide etch.

Process 300 continues with step 324. Step 324 (refer to FIG. 4L) involves selectively removing SiGe with respect to surrounding materials, using isotropic etching process, such as vapor phased HCl dry etch.

Process 300 continues with step 326. Step 326 (refer to FIG. 4M) involves selective Si trimming. Selectively trim Si means that the process involves selectively etching (i.e., removing) Si from the surround materials (i.e., a selective isotropic Si etch by dry or wet etch method.). 401 of FIG. 4M denotes the OPL.

Process 300 continues with step 328. Step 328 (refer to FIG. 4N) involves removing OPL that was created in step 316. Any etching/removing techniques may be used to remove the OPL, such as N2/H2 ash.

Process 300 concludes with step 330. Step 330 (refer to FIG. 4O) involves forming/depositing a dielectric layer (filling in the cavity) and a CMP. Another portion of step 330 (refer to FIG. 4P) involves replacing dummy gate with RMG (replacement metal gate). It is noted that, all dummy gates materials and sacrificial SiGe are removed, and are replaced with high-k/metal gate stacks.

Figure 5:
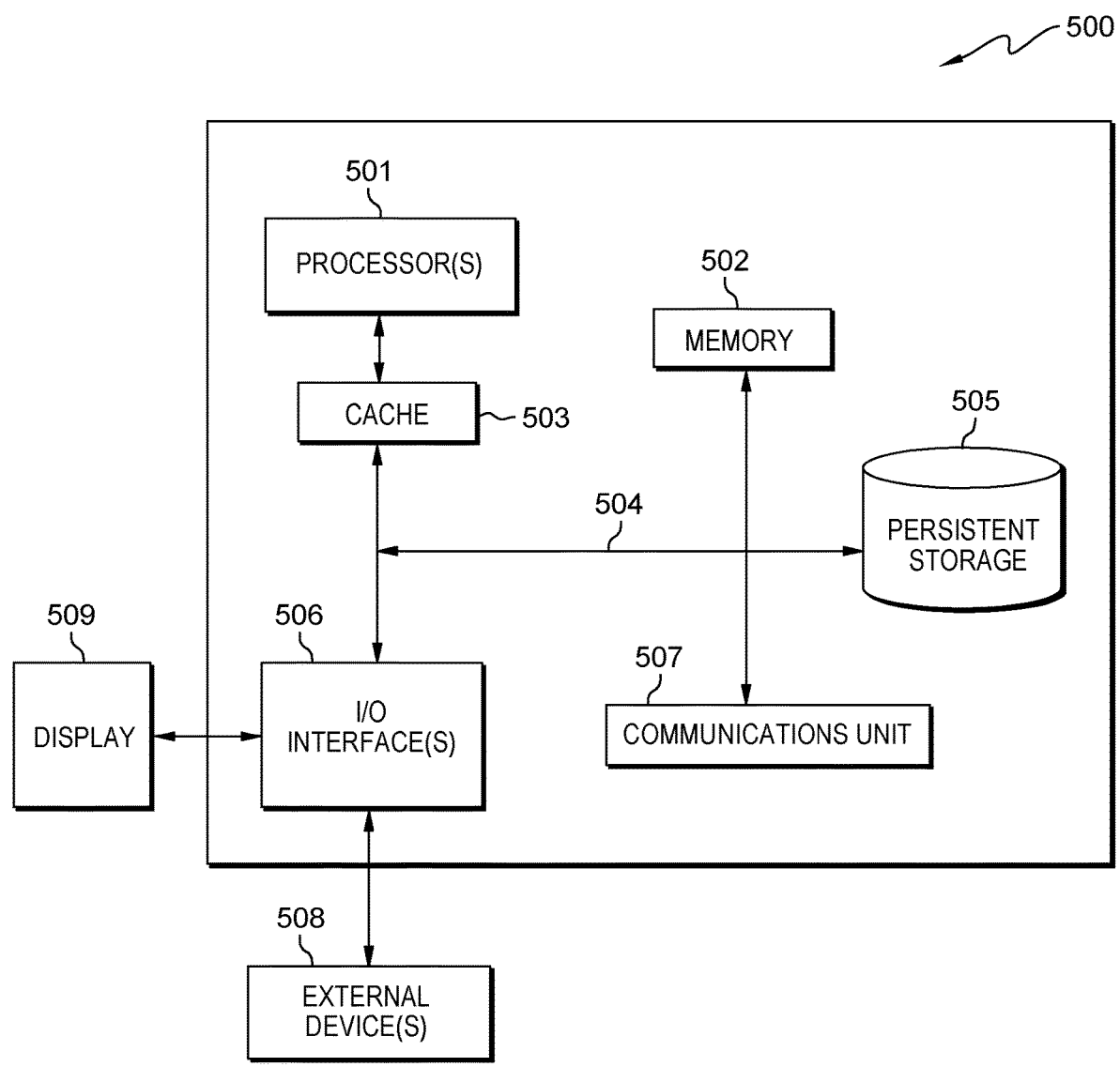
FIG. 5 depicts a block diagram, designated as 500, of components of a server computer capable of executing process 300 and process 400, in accordance with an embodiment of the present invention.

FIG. 5 includes processor(s) 501, cache 503, memory 502, persistent storage 505, communications unit 507, input/output (I/O) interface(s) 506, and communications fabric 504. Communications fabric 504 provides communications between cache 503, memory 502, persistent storage 505, communications unit 507, and input/output (I/O) interface(s) 506. Communications fabric 504 can be implemented with any architecture designed for passing data and/or control information between processors (such as microprocessors, communications and network processors, etc.), system memory, peripheral devices, and any other hardware components within a system. For example, communications fabric 504 can be implemented with one or more buses or a crossbar switch.

Memory 502 and persistent storage 505 are computer readable storage media. In this embodiment, memory 502 includes random access memory (RAM). In general, memory 502 can include any suitable volatile or non-volatile computer readable storage media. Cache 503 is a fast memory that enhances the performance of processor(s) 501 by holding recently accessed data, and data near recently accessed data, from memory 502.

Program instructions and data (e.g., software and data x10) used to practice embodiments of the present invention may be stored in persistent storage 505 and in memory 502 for execution by one or more of the respective processor(s) 501 via cache 503. In an embodiment, persistent storage 505 includes a magnetic hard disk drive. Alternatively, or in addition to a magnetic hard disk drive, persistent storage 505 can include a solid state hard drive, a semiconductor storage device, a read-only memory (ROM), an erasable programmable read-only memory (EPROM), a flash memory, or any other computer readable storage media that is capable of storing program instructions or digital information.

The media used by persistent storage 505 may also be removable. For example, a removable hard drive may be used for persistent storage 505. Other examples include optical and magnetic disks, thumb drives, and smart cards that are inserted into a drive for transfer onto another computer readable storage medium that is also part of persistent storage 505. Process 300 can be stored in persistent storage 505 for access and/or execution by one or more of the respective processor(s) 501 via cache 503.

Communications unit 507, in these examples, provides for communications with other data processing systems or devices. In these examples, communications unit 507 includes one or more network interface cards. Communications unit 507 may provide communications through the use of either or both physical and wireless communications links. Program instructions and data (e.g., process 300) used to practice embodiments of the present invention may be downloaded to persistent storage 505 through communications unit 507.

I/O interface(s) 506 allows for input and output of data with other devices that may be connected to each computer system. For example, I/O interface(s) 506 may provide a connection to external device(s) 508, such as a keyboard, a keypad, a touch screen, and/or some other suitable input device. External device(s) 508 can also include portable computer readable storage media, such as, for example, thumb drives, portable optical or magnetic disks, and memory cards. Program instructions and data (e.g., process 300) used to practice embodiments of the present invention can be stored on such portable computer readable storage media and can be loaded onto persistent storage 505 via I/O interface(s) 506. I/O interface(s) 506 also connect to display 509.

Display 509 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for forming single diffusion break for nanosheet IC (integrated circuit), the method comprising:
   forming a gate cut opening in a dummy gate of one or more gates on a substrate, wherein the substrate comprises nanosheet stacks, fully formed gates with spacers, S/D (source/drain) epis (epitaxial layer) and BDI (bottom dielectric interface) layer;
   forming a first sacrificial material on the gate cut opening;
   creating a single diffusion break;
   removing the dummy gate and oxide layer from the dummy gate;
   removing, selectively, a second sacrificial material;
   trimming, selectively, stack of nanosheets;
   forming dielectric in the gate cut opening and the single diffusion break.

2. The method of claim 1, further comprising:
   forming the one or more gates, BDI (bottom dielectric isolation), one or more gate spacers and one or more S/D (source/drain) epis (epitaxies) on a substrate;
   depositing a second sacrificial material, wherein the second sacrificial material is made of SiGe;
   depositing the gate cut opening with a-Si material;
   depositing the oxide layer in the dummy gate of the one or more gates; and
   etching the one or more gates.

3. The method of claim 2, wherein forming the gate cut opening in the dummy gate of the one or more gates further comprising:
   patterning the dummy gate; and
   etching the dummy gate.

4. The method of claim 2, wherein forming the first sacrificial material on the gate cut opening further comprising:
   depositing OPL (organic planarization layer) as the first sacrificial material into the gate cut opening.

5. The method of claim 2, wherein creating the single diffusion break further comprising:
   patterning the single diffusion break over the gate cut opening.

6. The method of claim 2, wherein removing the dummy gate and dummy oxide layer further comprising:
   etching the dummy gate; and
   etching the oxide layer.

7. The method of claim 2, wherein removing, selectively, the second sacrificial material further comprising:
   etching layers of SiGe as the sacrificial material, wherein the layers of SiGe are located between stacks of nanosheets.

8. The method of claim 2, wherein trimming, selectively, the stack of nanosheets further comprising:
   etching the stack of nanosheets from the single diffusion break.

9. The method of claim 2, wherein forming dielectric material in the gate cut opening further comprising:
   depositing the dielectric material in the gate cut opening; and
   polishing the dielectric material using CMP (chemical mechanical polishing) technique.

* * * * *